United States Patent [19]

Miller et al.

[11] Patent Number: 4,728,462
[45] Date of Patent: Mar. 1, 1988

[54] FERROPHOSPHORUS COMPOSITION HAVING IMPROVED CONDUCTIVITY AND PASSIVATION RESISTANCE

[75] Inventors: George T. Miller, Lewiston; Gerald L. Evarts, Tonawanda, both of N.Y.

[73] Assignee: Occidental Chemical Corporation, Niagara Falls, N.Y.

[21] Appl. No.: 848,012

[22] Filed: Apr. 3, 1986

[51] Int. Cl.$^4$ .............................................. H01B 1/06
[52] U.S. Cl. .................................... 252/513; 252/516; 252/519; 252/512; 428/403; 428/570; 427/216; 427/217; 75/251
[58] Field of Search ............................... 427/216, 217; 252/513/516, 512, 519, 521; 420/129, 50, 8; 428/403, 570; 75/251

[56] References Cited

U.S. PATENT DOCUMENTS

| 3,562,124 | 2/1971 | Leon et al. | 204/148 |
| 4,447,492 | 5/1984 | McKaveney | 252/500 |
| 4,517,118 | 5/1985 | Stoetzer | 252/513 |

Primary Examiner—Josephine Barr
Attorney, Agent, or Firm—James F. Tao; William G. Gosz

[57] ABSTRACT

A ferrophosphorus composition with improved conductivity and passivation resistance is prepared by treating ferrophosphorus particles with an aqueous solution containing a dilute mineral acid and ions of chromium and a metal selected from the group consisting of zinc, strontium, calcium, barium, lead or copper. In a preferred embodiment, the concentration of chromium and zinc ions in the solution is in the range of about 2 grams/liter to about 10 grams/liter, and the treatment time is from about 2 to about 6 minutes.

The treated ferrophosphorus particles can be formulated in a suitable resin binder for use as corrosion resistant coatings, weldable coatings, EMI shielding coatings or electrically conductive coatings. The treated ferrophosphorus particles can also be used in powder metallurgy applications.

13 Claims, No Drawings

FERROPHOSPHORUS COMPOSITION HAVING IMPROVED CONDUCTIVITY AND PASSIVATION RESISTANCE

BACKGROUND OF THE INVENTION

The present invention relates to a particulate ferrophosphorus composition having a surface deposit comprising mixed ions of chromium and a metal selected from the group consisting of zinc, strontium, calcium, barium, lead or copper. The surface deposit is sufficiently thin to provide the particles with enhanced conductivity and passivation resistance.

Coatings which are designed to provide cathodic corrosion protection for metal structures such as pipes, storage tanks, bridges, and the like, as well as metal surfaces used in marine applications, such as ship hulls, support structures for drilling rigs, docks, and the like, are well known in the art. The active component of such coatings generally forms an internal battery with the metal surface to be protected and thus act as sacrificial anodes. These coatings contain metal particles which are more anodic than the metal surface to be protected. The metal particles are present as a pigment in a suitable binder. Coating compositions utilize many organic or inorganic binder materials and a conductive metal such as particles of zinc.

In order to provide effective corrosion protection to the metal surface, appreciable amounts of zinc, i.e. 80% or more by weight of the total solids composition, are frequently used in the coating. Since zinc is a relatively expensive metal for this purpose, such large amounts of zinc add greatly to the cost of providing such protection.

Previous attempts to provide lower cost substitutes for zinc-rich coatings have focused on substituting other suitable metal pigment materials for at least a portion of the zinc in the coatings. The use of ferrophosphorus powder as a replacement for up to 50% or more of the zinc in these coatings is well established. See U.S. Pat. No. 3,562,124, issued Feb. 9, 1971. The resulting coating composition is not only less expensive than conventional zinc-rich coatings, but also, in some instances, possesses enhanced corrosion protection. Ferrophosphorus particles which are used in such applications are available commercially from the Occidental Chemical Corporation under the trademark Ferrophos ® pigment.

The use of Ferrophos pigment in electromagnetic interference shielding (EMI) applications is also disclosed in the prior art. See U.S. Pat. No. 4,447,492, issued May 8, 1984 and U.S. Pat. No. 4,517,118, issued May 14, 1985. These patents disclose the use of Ferrophos alone or in combination with other conductive materials, such as nickel powder, in coating compositions which can be used to coat plastic substrates for electromagnetic interference shielding purposes. In this application, the coating serves to protect the substrate from electromagnetic energy emanating from other sources, or to prevent the escape of electromagnetic energy from within a housing formed from the plastic material. In order to be effective in this application, a pigment desirably has a high conductivity, i.e. 0.1 ohm-centimeter or less, as well as superior magnetic properties, and must be capable of providing attenuations of 30 decibels or more over a frequency range of 0.5 to 1,000 mhz.

Other applications for Ferrophos include electrostatic dissipation coatings and conductive coatings for use as components of electrical contacts, connectors, switches and printed circuit boards.

In all of these various applications, good electrical conductivity is essential and this will depend on good interparticle contact. An electrical current should flow from particle-to-particle with the lowest amount of contact resistance. Interparticle resistivity can increase, however, due to the formation of an oxide or other passivating film on the surface of the particle. Although relatively thin in terms of the dimensions of the particle, e.g. perhaps only a few atoms thick, these passivation layers impart a high resistivity to the surface of the particle and thus reduce the flow of current between contiguous particles. Attempts to clean the surface of the particles using, for instance, a dilute mineral acid solution are only temporarily successful since the passivation layer will readily reform on the particle surface. For this reason, most non-noble metals, such as copper and iron, are readily passivated and therefore fail in such applications. The failure rate is accelerated under conditions of elevated temperature and high humidity.

It will be readily appreciated, therefore, that a continuing need exists for inexpensive conductive pigments having improved characteristics such as electrical and magnetic properties, as well as improved resistance to passivation.

SUMMARY OF THE INVENTION

In accordance with the present invention, a ferrophosphorus composition having improved conductivity and passivation resistance is prepared by treating ferrophsophorus particles with an aqueous solution containing a dilute mineral acid and ions of chromium and a metal selected from the group consisting of zinc, strontium, calcium, barium, lead, copper, and mixtures thereof. The treatment time generally various from about one minute to about 30 minutes, and the concentration of chromium and metal ions in the solution is in the range of 0.5 grams/liter to about 20 grams/liter. The chromium ions can be supplied by an alkali metal chromate, such as potassium dichromate, while the metal ions can be supplied by a metal salt, such as zinc sulfate. Although any ferro alloy is suitable in the practice of this invention, ferrophosphorus particles having an average size within the range of about 1 to about 15 microns are preferred. The coated ferrophosphorus particles have a surface modification which comprises an extremely thin layer of mixed chromium and metal ions sufficient to passivate the surface of the particles while allowing interparticle conductivity. Such particles, either alone or in combination with other metals such as zinc and nickel, are useful in a variety of applications including corrosion-resistant paints, weldable coatings, EMI shielding paints and electrically conductive coatings. In these applications, the particles are formulated in a suitable binder for application to an appropriate substrate.

DESCRIPTION OF THE PREFERRED EMBODIMENTS

The ferrophosphorus particles of the present invention have an average size within the range of about 1 to 15 microns, and preferably within the range of 2 to 12 microns. This refractory ferro alloy is an iron phosphide compound, generally containing from about 20 to 28% by weight of phosphorus and corresponding chemically to a mixture of $Fe_2P$ and $FeP$. The principle impurities occurring in commercial ferrophosphorus compositions are silicon, titanium, calcium and manganese, as well as trace amounts of other elements. Of these, silicon and manganese are the major impurities, typically being present in amounts of up to 7% by weight. Ferrophosphorus is obtained as a by-product in the commercial manufacture of elemental phosphorus by the electric furnace reduction of phosphate ores, the iron present in the phosphate ores forming the iron phosphide material. Although ferrophosphorus is the preferred ferro alloy of this invention, other refractory ferro alloys are also suitable and include ferromanganese, ferromolybdenum, ferrosilicon, ferrochrome, ferrovanadium, ferrozirconium, ferrotitanium, ferrotungsten, ferroboron, iron carbide, and the like. These ferro alloys all have the characteristics of being electrically conductive, brittle, and substantially unreactive in water, dilute acidic or alkaline environments.

The ferro alloy is pulverized by being subjected to suitable crushing or grinding operations in order to obtain particles within the desired size ranges.

Following particle size reduction, it has been found that the surface of the ferro alloy particles are passivated, i.e. the resistivity of the particles has increased substantially due to the formation of a thin surface film of unknown composition. This surface film can be removed by washing the particles in an aqueous solution of a dilute mineral acid such as hydrochloric acid or sulfuric acid. Following the acid wash, the conductivity of the particles has been observed to increase by several orders of magnitude. However, this increased conductivity is transitory and the resistivity of the particles increases rapidly after a short period of time. This increase in resistivity is promoted by high humidity and/or high temperature environments.

In order to inhibit the passivation of the surface of the particles and increase the conductivity, the particles are contacted with an aqueous solution containing a dilute mineral acid, ions of chromium and ions of a metal selected from the group consisting of zinc, strontium, calcium, barium, lead, copper, or mixtures of these metal ions. The mineral acid, such as either sulfuric acid, hydrochloric acid or nitric acid, should preferably have a final solution concentration within a range of about 1 to 12%. The purpose of the mineral acid is to remove the passivation layer and permit the chromium and metal ions to be deposited on the particle surface. The chromium ions can be advantageously supplied by dissolving a water soluble chromium compound in the solution. Suitable chromium compounds include alkali metal chromates or dichromates, such as potassium dichromate, or chromic acid. As used in this specification and claims, the terms "chromate" and "chromium ions" are intended to include any soluble hexavalent chromate source such as dichromates and dichromium ions as well. The metal ions can also be supplied by a water soluble metal salt such as, in the case of zinc salts, zinc sulfate, zinc chloride, zinc acetate, zinc formate, zinc nitrate and zinc fluoride. In a preferred embodiment, the chromate is potassium dichromate and the zinc salt is zinc sulfate. Although not wishing to be bound by any theory of operability, this particular preferred combination is believed to deposit an extremely thin layer of perhaps a few atoms in thickness of zinc chromate or zinc dichromate onto the cleaned particle surface. Such a layer, however, is too thin to detect using even sophisticated analytical techniques such as X-ray diffraction. Although this layer has not been positively identified as such, it is believed to be present on the surface of the particle in some fashion. The use of zinc chromate or zinc dichromate as a source of zinc and chromium ions would not be effective since these zinc salts are not adequately soluble in aqueous solutions.

In a typical coating procedure, an aqueous solution having the desired concentrations of these components is established and the ferro alloy particles are added to the solution with thorough agitation or mixing. The mixing time can vary from about one minute to about 30 minutes, and preferably from about 2 minutes to about 6 minutes. The concentration of both the chromium and metal ions in the solution can also vary from about 0.5 grams/liter to about 20 grams/liter, and preferably from about 2 grams/liter to about 10 grams/liter. After the mixing is completed, the treated ferro alloy particles can be separated from the solution using a centrifuge, vacuum filter, or some other equivalent separation technique or device. Since the mixing time is relatively short in duration, rapid separation of the ferro alloy particles from the solution is desirable. The pH of the solution is preferably less than about two. Thereafter, the ferro alloy may be rinsed with water and dried prior to further formulation with a resin binder.

A coating composition containing the treated ferro alloy particles of the present invention may be formulated by admixing the ferro alloy particles with a suitable binder using conventional mixing techniques. This coating composition can also include other conductive metals such as zinc metal, for improved corrosion protection and weldability, and nickel for EMI shielding applications and other applications requiring electrical conductivity.

More specifically, when the ferro alloy compositions of the present invention are incorporated into a coating formulation, the binder component of the formulation comprises 5 to 50% by weight of the non-volatile components, and preferably from 10% to 30% by weight of the non-volatile components. Various binder materials, both organic and inorganic, may be used, the choice of a particular resin binder being dependent upon the characteristics which are desired for the particular application. Typical binders include various synthetic resins, such as epoxies, chlorinated rubber, polystyrene, polyvinyl acetate resins, silicones, silanes, borates, silicates, acrylics, polyurethanes, and the like. The use of these and other similar binder materials will be readily apparent to those skilled in the art.

The pigment component of the coating, which includes the treated ferro alloy particles, can be present in an amount of from about 50% to about 95% by weight of the total non-volatile coating composition, with amounts within the range of about 70% to about 90% by weight being preferred. In addition to the treated ferro alloy particles, the pigment can also include particles of other conductive metals. As mentioned previously, zinc metal particles are preferred in applications such as corrosion protection, while nickel metal is preferred in conductive and EMI shielding applications. The metal particles are pigment grade typically having average sizes within the range of about 1 to 15 microns. In some instances, due to the relatively high cost of zinc and nickel, it may be desirable to omit these entirely. It is believed, however, that the amount of zinc or nickel required in each instance to impart the desired characteristics to the coating will be readily ascertainable by those skilled in the art.

Depending upon the particular binder which is selected, the coating composition may also contain suitable solvents, curing agents, suspending agents, plasticizers and the like. The selection of the type and amounts of these other components will depend on the particular binder as well as the ultimate characteristics desired for the particular coating composition and its use.

The formulated coating composition may be applied to a suitable substrate using any available technique such as, for example, spraying, brushing, immersion, flowing, or the like. Typically, the coating composition is applied to produce a film having a thickness within the range of about 0.5 to 10 mils, although thicknesses which are outside of this range may also be used to advantage. Typical metal substrates where corrosion protection is desired include ship hulls, bridges, pipes, storage tanks, coil coat applications, and the like. Substrates where weldability is desired include many of the above. EMI shielding substrates are typically plastic materials which house electronic components such as computer consoles, instrument housings and the like. For static dissipation applications, substrates may be metal or non-metal on which a conductive coating is formed.

The following specific examples are provided as exemplary of various embodiments of the present invention, but are not intended to limit the full scope of the invention as defined by the appended claims.

EXAMPLES 1-5

Various amounts of potassium dichromate, zinc sulfate and sulfuric acid were mixed with 30 cc of distilled water in a 600 cc beaker. 70 cc of distilled water was added to this mixture.

Ferrophos ® pigment, a particulate ferrophosphorus powder manufactured and sold by the Occidental Chemical Corporation, designated HRS 2131 with a mean particle size of 5 microns, was then added to the mixture and stirred by hand for four (4) minutes, vacuum filtered and washed three (3) times with distilled water and three (3) times with acetone.

The treated ferrophosphorus was then dried using a heat gun under a flow of nitrogen.

The following Table 1 summarizes the resistivity of ferrophosphorus samples treated with solutions containing various concentrations of zinc sulfate, potassium dichromate and sulfuric acid. These results were obtained by compressing the treated ferrophosphorus particles into a cylinder 0.7 cm high having a volume of approximately 1 cc, and measuring the resistivity from the top to the bottom of the cylinder. Resistance to passivation was determined by measuring the resistivity of the particles after subsequent wetting with water and drying for ½ hour at 108° C.

TABLE 1

| Example No. | 1 | 2 | 3 | 4 | 5 |
|---|---|---|---|---|---|
| Ferrophosphorus (grams) | 92.0 | 92.0 | 92.0 | 92.0 | 92.0 |
| Zinc Sulphate (56%) (grams) | 0.179 | 0.358 | 0.358 | 0.179 | 0.4 |
| Potassium Dichromate (grams) | 0.2 | 0.4 | 0.4 | 0.2 | 0.5 |
| Sulfuric Acid (50%) (cc) | 3 | 6 | 12 | 12 | 12 |
| Distilled Water (cc) | 100 | 100 | 100 | 100 | 100 |
| Resistivity (ohms) (After Drying) | 2.3 | 1.2 | 1.6 | 1.2 | 1.2 |
| Resistivity (ohms) (After Passivation Test) | 3.5 | 2.6 | 1.5 | 2.3 | 2.2 |

EXAMPLE 6

For purposes of comparison, the procedure of Examples 1-5 was repeated except that the treating solution did not contain zinc or chromate ions. Resistivity of the ferrophosphorus sample after drying was recorded as 4.8 ohms. After rewetting and drying at 108° C., a resistivity of 19 ohms was recorded.

EXAMPLE 7

The procedure of Examples 1-5 was repeated by mixing 1.8 grams of zinc sulfate, 2.0 grams of potassium dichromate, 60 grams of 50% sulfuric acid and 50 grams of distilled water. 450 grams of distilled water was added to this mixture, followed by the addition of 460 grams of ferrophosphorus particles under agitation. The pH of the solution decreased from 1.7 to 0-0.5. After three minutes of moderate agitation, the treated particles were separated from the solution and filtered through a suction apparatus. The treated particles were rinsed with distilled water and acetone. The pigment was air-dried at room temperature overnight and a resistivity of 0.7 ohms was recorded. This compared with a resistivity of 52 ohms for the untreated particles.

EXAMPLES 8-12

950 grams of Elvacite 2046, an acrylic resin manufactured and sold by the E. I. DuPont Co., 1180 grams of toluene, 100 grams of isopropyl alcohol, 550 grams of cellosolve, 50 grams of cellosolve acetate, 300 grams of diacetone alcohol, and 50 grams of methyl ethyl ketone were mixed to prepare a resin having a solids content of about 30%. 66 grams of this liquid resin solution was mixed with 50 ml. of a toluene/cellosolve mixture (10:1).

The resulting resin solution was then mixed with various pigments as shown in the following Table 2 at equivalent pigment to binder ratios of 5 to 1. The "treated" ferrophosphorus referred to in the table was treated in accordance with the procedure of Example 3.

The coatings were applied to an ABS plastic substrate, and the resistivities were recorded after one day and after one week of room temperature air drying.

TABLE 2

| Example No. | 8 | 9 | 10 | 11 | 12 |
|---|---|---|---|---|---|
| Nickel Flake (grams) | 100 | 50 | 50 | | |
| Standard ferrophosphorus (grams) | | 50 | | 100 | |
| Treated ferrophosphorus (grams) | | | 50 | | 100 |
| Standard zinc (grams) | | | | | |
| Coating Thickness (mils) | 1.5-1.75 | 1.0-1.5 | 0.75-1.5 | 1.0-1.5 | 1.0-1.5 |
| Resistivity (ohms - square 1 day room temperature) | 8 | 21 | 11-12 | 25 M | 1200 |
| Resistivity (ohms - square after 1 week at room temperature) | 6-7.5 | 18-19 | 10-11 | 5 M | 875 |
| Coating Thickness (mils) | 2-3 | 1.5-2.5 | 1-2 | 2 | 1.5-2 |

TABLE 2-continued

| Example No. | 8 | 9 | 10 | 11 | 12 |
|---|---|---|---|---|---|
| Resistivity (ohms - square 1 day at room temperature) | 4.5 | 11–12 | 8–9 | 2000 | 180 |
| Resistivity (ohms - square after 1 week at room temperature) | 4 | 12–13 | 6–10 | 1100–1200 | 130–160 |

EXAMPLE 13

Example 11 was repeated except that a pigment to binder ratio of 8 to 1 was used. After 1 week room temperature air drying, resistivities of 1300–1500 ohms square and 380–400 ohms square were recorded for coating thicknesses of 1–1.5 mils and 1.5–2 mils, respectively.

EXAMPLE 14

Example 12 was repeated except that a pigment to binder ratio of 8 to 1 was used. After 1 week room temperature air-drying, resistivities of 95 ohms square and 35–40 ohms square were recorded for coating thicknesses of 1–1.5 mils and 1.5–2 mils, respectively.

Although the present invention has been described with respect to several illustrative embodiments, it should not be interpreted as being so limited. As will be evident to those skilled in the art, other substitutions and equivalents are possible without departing from the spirit of the invention or the scope of the claims.

What is claimed is:

1. A process for treating ferro alloy particles to provide passivation resistance and enhanced conductivity to the particles, said process comprising the steps of:
   (a) contacting ferro alloy particles having an average size within the range of about 1 to about 15 microns with an aqueous solution containing a dilute mineral acid having a solution concentration within the range of about 1% to about 12%, and ions of chromium and a metal selected from the group consisting of zinc, strontium, calcium, barium, lead, copper and mixtures thereof, said solution having a concentration of chromium and metal ions in the range of about 0.5 grams/liter to about 20 grams/liter,
   (b) separating the treated ferro alloy particles from the solution after a contact time of from about 1 to about 30 minutes, and
   (c) drying the treated Ferro alloy particles.

2. The process of claim 1 wherein the ferro alloy is ferrophosphorus.

3. The process of claim 2 wherein the mineral acid is hydrochloric acid or sulfuric acid.

4. The process of claim 2 wherein the chromium ions are supplied by dissolving an alkali metal chromate or chromic acid in water.

5. The process of claim 4 wherein the alkali metal chromate is potassium dichromate.

6. The process of claim 2 wherein the metal ions are zinc ions.

7. The process of claim 6 wherein the zinc ions are supplied by dissolving a zinc salt in water, said zinc salt being selected from the group consisting of zinc sulfate, zinc chloride, zinc acetate, zinc formate, zinc nitrate and zinc fluoride.

8. The process of claim 2 wherein the ferrophosphorus particles are in contact with the chromium and metal ions for a period of time of from about 2 to about 6 minutes.

9. The process of claim 2 wherein the concentration of chromium and metal ions in the solution is in the range of about 2 grams/liter to about 10 grams/liter.

10. A product produced by the process of claim 2.

11. Ferro alloy particles formed by the process of claim 1.

12. The particles of claim 11 wherein the ferro alloy is ferrophosphorous.

13. The particles of claim 12 wherein the metal is zinc.

* * * * *